US012622150B2

(12) United States Patent
Li et al.

(10) Patent No.: US 12,622,150 B2
(45) Date of Patent: May 5, 2026

(54) DISPLAY PANEL AND METHOD FOR MANUFACTURING THE SAME, AND DISPLAYING DEVICE

(71) Applicants: Chengdu BOE Optoelectronics Technology Co., Ltd., Chengdu (CN); BOE Technology Group Co., Ltd., Beijing (CN)

(72) Inventors: Zhen Li, Beijing (CN); Yunhao Wang, Beijing (CN); Ming Yang, Beijing (CN); Cheng Liu, Beijing (CN); Jing Chen, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 357 days.

(21) Appl. No.: 18/028,018

(22) PCT Filed: May 25, 2022

(86) PCT No.: PCT/CN2022/095031
§ 371 (c)(1),
(2) Date: Mar. 23, 2023

(87) PCT Pub. No.: WO2023/225913
PCT Pub. Date: Nov. 30, 2023

(65) Prior Publication Data
US 2024/0357898 A1 Oct. 24, 2024

(51) Int. Cl.
H10K 59/38 (2023.01)
H10K 59/12 (2023.01)
(Continued)

(52) U.S. Cl.
CPC ......... H10K 59/38 (2023.02); H10K 59/1201 (2023.02); H10K 59/131 (2023.02);
(Continued)

(58) Field of Classification Search
CPC .. H10K 59/38; H10K 59/1201; H10K 59/131; H10K 59/40; H10K 59/8792; H10K 2102/351; H10K 59/00; G02B 5/20
See application file for complete search history.

(56) References Cited

U.S. PATENT DOCUMENTS

2020/0312915 A1* 10/2020 Sun ....................... H10K 50/84
2022/0262865 A1 8/2022 Hou et al.
2023/0059728 A1 2/2023 Wang et al.

FOREIGN PATENT DOCUMENTS

CN 105573561 A 5/2016
CN 111584594 A 8/2020
(Continued)

OTHER PUBLICATIONS

Office Action dated Mar. 23, 2026, issued in counterpart CN Application No. 202280001422.3, with English translation. (16 pages).

*Primary Examiner* — Elmito Breval
(74) *Attorney, Agent, or Firm* — WHDA, LLP

(57) ABSTRACT

A display panel and a method for manufacturing the same, and a displaying device, which relates to the technical field of displaying. The display panel includes: a displaying substrate, a color light filtering layer disposed at a light exiting side of the displaying substrate. The color light filtering layer includes a first light filtering structure and a second light filtering structure of unequal thicknesses, orthographic projections of the light filtering structures on the displaying substrate cover corresponding positions of the light emitting region, and a surface of the first light filtering structure at one side away from the displaying substrate and
(Continued)

a surface of the second light filtering structure at one side
away from the displaying substrate are in a same plane.

13 Claims, 5 Drawing Sheets

(51) Int. Cl.
H10K 59/131        (2023.01)
H10K 59/40          (2023.01)
H10K 59/80          (2023.01)
H10K 102/00           (2023.01)

(52) U.S. Cl.
CPC ......... H10K 59/40 (2023.02); H10K 59/8792
(2023.02); H10K 2102/351 (2023.02)

(56)                    References Cited

FOREIGN PATENT DOCUMENTS

| | | | |
|---|---|---|---|
| CN | 111682048 | A | 9/2020 |
| CN | 112234087 | A | 1/2021 |
| JP | 2014-048646 | A | 3/2014 |
| WO | 2021/218629 | A1 | 11/2021 |

* cited by examiner providing a displaying base plate, wherein the displaying base plate comprises at least one light emitting region and a non-light emitting region ⟍ S301 forming a color light filtering layer on a light exiting side of the displaying base plate, wherein   the color light filtering layer includes a plurality of light filtering structures, and orthographic projections of the light filtering structures on the displaying substrate cover corresponding positions of the light emitting region; wherein the plurality of light filtering structures include a first light filtering structure and a second light filtering structure, a thickness of the first light filtering structure and a thickness of the second light filtering structure are different, and a surface of the first light filtering structure at one side away from the displaying substrate and a surface of the second light filtering structure at one side away from the displaying substrate are in a same plane ⟍ S302

FIG. 9 forming a functional film layer at the light exiting side of the displaying base plate ⟍ S401 performing exposure and development and/or etching to a surface   of the functional film layer at one side away from the displaying base plate, to obtain a first slot ⟍ S402 forming the color light filtering layer at one side of the functional film layer away from the displaying base plate, wherein the first light filtering member fills the first slot ⟍ S403

FIG. 10

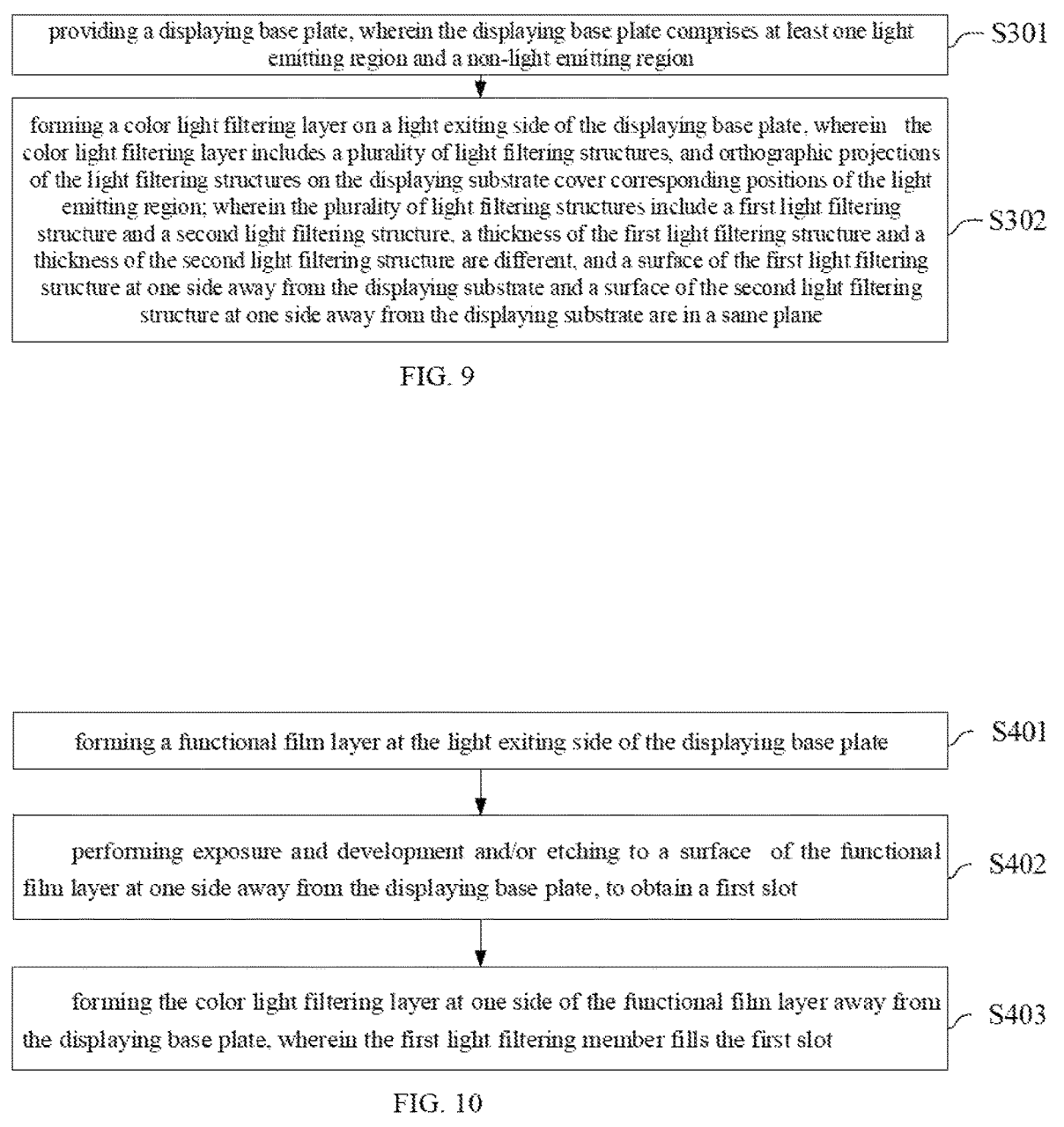

DISPLAY PANEL AND METHOD FOR MANUFACTURING THE SAME, AND DISPLAYING DEVICE

TECHNICAL FIELD

The present disclosure relates to the technical field of displaying and, more particularly, to a display panel, a manufacturing method, and a displaying device.

BACKGROUND

In the organic light-emitting diode (OLED) display technique, the Red, Green, Blue (RGB) pixel light emission is performed by using organic light emitting devices. In order to reduce the interference by the ambient light, and increase the contrast of the displaying, currently, the color filter on encapsulation (COE) technique or the Pol-less technique has been employed, to replace the conventional solutions of polarizers, in which a color light filter exports the lights of three primary colors generated by the excitation by an organic light-emitting device, and reduces the reflectivity of the external ambient light.

SUMMARY

The present disclosure provides a display panel including:
a displaying substrate, including at least one light emitting region and a non-light emitting region; and
a color light filtering layer disposed at a light exiting side of the displaying substrate, wherein the color light filtering layer includes a plurality of light filtering structures, and orthographic projections of the light filtering structures on the displaying substrate cover corresponding positions of the light emitting region; and
the plurality of light filtering structures include a first light filtering structure and a second light filtering structure, a thickness of the first light filtering structure and a thickness of the second light filtering structure are different, and a surface of the first light filtering structure at one side away from the displaying substrate and a surface of the second light filtering structure at one side away from the displaying substrate are in a same plane.
In an alternative implementation, the plurality of light filtering structures further include a third light filtering structure; and the surface of the first light filtering structure at one side away from the displaying substrate, the surface of the second light filtering structure at one side away from the displaying substrate and a surface of the third light filtering structure at one side away from the displaying substrate are in the same plane.
In an alternative implementation, filtered-light colors of the light filtering structures are the same as emitted-light colors of the corresponding positions of the light emitting region, and thicknesses of the light filtering structures are positively correlated with luminous efficiencies of the corresponding positions of the light emitting region.
In an alternative implementation, the thickness of the first light filtering structure is larger than the thickness of the second light filtering structure, and the thickness of the second light filtering structure is larger than or equal to a thickness of the third light filtering structure.
In an alternative implementation, the display panel further includes a black matrix disposed in a same layer as the color light filtering layer, and an orthographic projection of the black matrix on the displaying substrate is located within the non-light emitting region.
In an alternative implementation, the display panel further includes a functional film layer disposed between the displaying substrate and the color light filtering layer, a first slot is disposed at a surface of the functional film layer at one side close to the color light filtering layer, and the first light filtering structure fills the first slot.
In an alternative implementation, an angle of gradient of a side wall of the first slot is larger than or equal to 20°, and less than or equal to 90°; and/or
a minimum distance between a boundary of an orthographic projection of a bottom face of the first slot on the displaying substrate and a boundary of the orthographic projection of the black matrix on the displaying substrate is larger than or equal to −2 μm, and less than or equal to 10 μm; and/or
a depth of the first slot is larger than or equal to 0.1 μm, and less than or equal to 2.4 μm.
In an alternative implementation, the second light filtering structure is disposed on a surface of the functional film layer at one side close to the color light filtering layer; or
a second slot is disposed at the surface of the functional film layer at the side close to the color light filtering layer, the second light filtering structure fills the second slot, and a depth of the second slot is less than a depth of the first slot.
In an alternative implementation, an angle of gradient of a side wall of the second slot is larger than or equal to 20°, and less than or equal to 90°; and/or
a distance between a boundary of an orthographic projection of a bottom face of the second slot on the luminescent layer and a boundary of the orthographic projection of the black matrix on the luminescent layer is larger than or equal to −2 μm, and less than or equal to 10 μm; and/or
a depth of the second slot is larger than or equal to 0.1 μm, and less than or equal to 2.4 μm.
In an alternative implementation, the third light filtering structure is disposed on the surface of the functional film layer at one side close to the color light filtering layer; or
a third slot is disposed at the surface the functional film layer at one side close to the color light filtering layer, the third light filtering structure fills the third slot, and a depth of the third slot is less than or equal to the depth of the second slot.
In an alternative implementation, the functional film layer is a touch control functional layer, and the touch control functional layer includes at least one of a buffer layer arranged in layer configuration, a first touch electrode layer, an insulating layer, a second touch electrode layer and a first planarization layer; and
the first touch electrode layer includes a first touch electrode, the second touch electrode layer includes a second touch electrode, and the first touch electrode and the second touch electrode are connected by a via hole disposed in the insulating layer.
In an alternative implementation, at least one protruding structure is disposed at a surface of each of the light filtering structures at a side away from the displaying substrate, and the protruding structure is for diverging light emitted by the corresponding positions of the light emitting region.
In an alternative implementation, the protruding structure is a hemispherical prism, and an orthographic projection of the protruding structure on the displaying substrate is a circle; and a diameter of the circle is larger than or equal to 1 μm, and less than or equal to 10 μm; and/or a spacing between circle centers of a plurality of circles is larger than or equal to 1 μm, and less than or equal to 20 μm.

In an alternative implementation, the at least one protruding structure includes a plurality of protruding structures, and the plurality of protruding structures are distributed in a polygonal array corresponding to the light emitting region of the displaying substrate.

In an alternative implementation, a maximum thickness of the light filtering structures is larger than or equal to 2 μm, and less than or equal to 10 μm; a height of the protruding structure is larger than or equal to 0 μm, and less than or equal to 4 μm; and a difference between the thickness of the light filtering structures and the height of the protruding structure is larger than or equal to 2 μm, and less than or equal to 10 μm.

In an alternative implementation, the display panel further includes at least one of:

a packaging layer located between the color light filtering layer and the displaying substrate; and a second planarization layer located at one side of the color light filtering layer away from the luminescent layer.

The present disclosure further provides a displaying device, wherein the displaying device includes the display panel according to any one of the above embodiments.

The present disclosure further provides a manufacturing method, wherein the method includes:

providing a displaying substrate, wherein the displaying substrate includes at least one light emitting region and a non-light emitting region; and forming a color light filtering layer at a light exiting side of the displaying substrate, wherein the color light filtering layer includes a plurality of light filtering structures, and orthographic projections of the light filtering structures on the displaying substrate cover corresponding positions of the light emitting region;

wherein the plurality of light filtering structures include a first light filtering structure and a second light filtering structure, a thickness of the first light filtering structure and a thickness of the second light filtering structure are different, and a surface of the first light filtering structure at one side away from the displaying substrate and a surface of the second light filtering structure at one side away from the displaying substrate are in a same plane.

In an alternative implementation, the step of forming the color light filtering layer on the light exiting side of the displaying substrate includes:

forming a functional film layer on the light exiting side of the displaying substrate;

performing exposure and development and/or etching to a surface of the functional film layer away at one side from the displaying substrate, to obtain a first slot; and forming the color light filtering layer at the one side of the functional film layer away from the displaying substrate, wherein the first light filtering structure fills the first slot.

The above description is merely a summary of the technical solutions of the present disclosure. In order to more clearly know the elements of the present disclosure to enable the implementation according to the contents of the description, and in order to make the above and other purposes, features and advantages of the present disclosure more apparent and understandable, the particular embodiments of the present disclosure are provided below.

BRIEF DESCRIPTION OF THE DRAWINGS

In order to more clearly illustrate the technical solutions of the embodiments of the present disclosure or the related art, the figures that are required to describe the embodiments or the related art will be briefly described below. Apparently, the figures that are described below are embodiments of the present disclosure, and a person skilled in the art can obtain other figures according to these figures without paying creative work. It should be noted that the scales in the drawings are merely illustrative and do not indicate the actual scales.

FIG. 9 schematically shows a flow chart of the steps of a manufacturing method according to the present disclosure; and FIG. 10 schematically shows a flow chart of the steps of a method for forming the color light filtering layer according to the present disclosure.

DETAILED DESCRIPTION

In order to make the objects, the technical solutions and the advantages of the embodiments of the present disclosure clearer, the technical solutions of the embodiments of the present disclosure will be clearly and completely described below with reference to the drawings of the embodiments of the present disclosure. Apparently, the described embodiments are merely certain embodiments of the present disclosure, rather than all of the embodiments. All of the other embodiments that a person skilled in the art obtains on the basis of the embodiments of the present disclosure without paying creative work fall within the protection scope of the present disclosure.

In organic light emitting devices in the related art, the luminous efficiencies of the organic luminescent materials used for emitting lights of different colors are usually unequal, and the light intensities of the lights of different colors are also unequal. If not treated correspondingly, that results in displaying problems of the displaying devices such as color cast in displaying. In the present disclosure, it is taken into consideration that, currently, the whole color light filter is stacked with the organic light emitting device, and cannot be used for ameliorating the light-intensity difference caused by the luminous efficiencies of the organic luminescent materials. Therefore, in the present disclosure, it is considered to adjust the thicknesses of the regions of the color light filter, so as to adjust the light transmittances of the regions of the color light filter, thereby balancing the light-intensity difference between the lights of different colors. As an example, if the light intensity is higher, the color light filter corresponding to that position of the pixel light emitting region has a higher thickness, and the transmittance is lower, to balance the excessively high light intensity.

However, in the present disclosure, it has been found that, when thickness differentiation of the regions of the color light filter is realized, the part whose thickness is reduced has the positive effect of an increased transmittance, but, at the same time, results in the increasing of the reflected light, and the synchronous increasing of the overall reflectivity. The thickness differentiation of the regions of the color light filter further results in divergence and interference of the ambient light, which, in the dark-state scenes of the displaying device, causes a poor usage experience of the user of the product. In the present disclosure, it has been found by further study that that is because the surfaces of the color light filter that are used for reflecting the external ambient light are not in the same one plane, which results in an increased overall reflectivity, and more serious color separation.

Figures 1, 2:
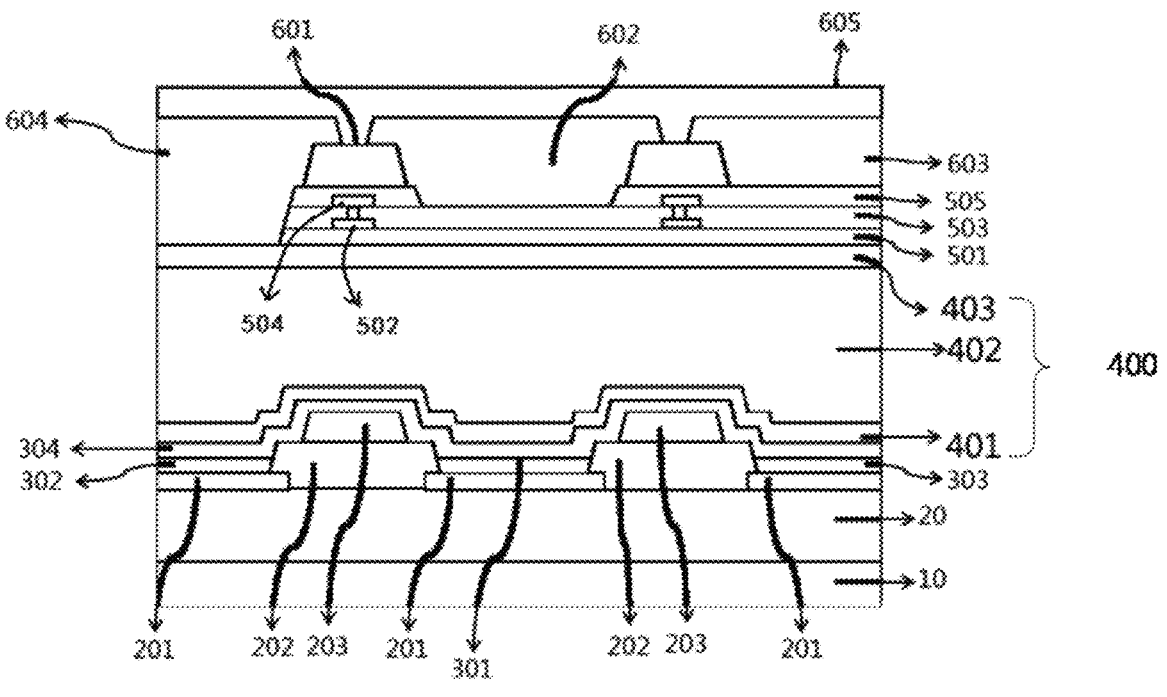
FIG. 1 schematically shows a schematic sectional structural diagram of a display panel according to the present disclosure.
FIG. 2 schematically shows a schematic sectional structural diagram of a first slot according to the present disclosure.
Figure 3:
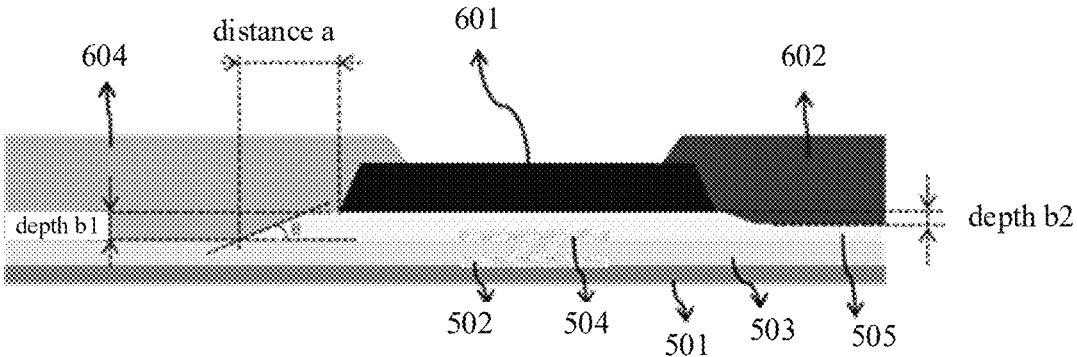
FIG. 3 schematically shows a schematic sectional structural diagram of a slot according to the present disclosure.
Figure 4:
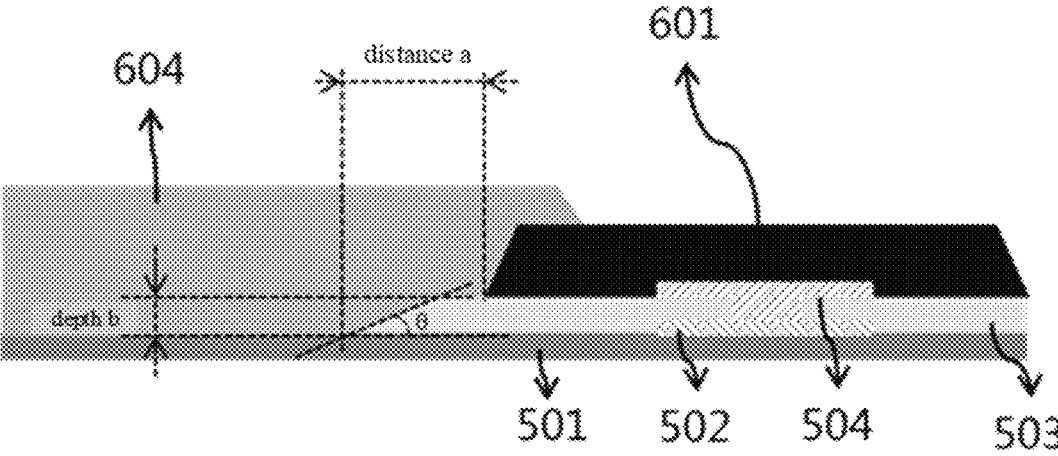
FIG. 4 schematically shows a schematic sectional structural diagram of another first slot according to the present disclosure.
Figure 5:
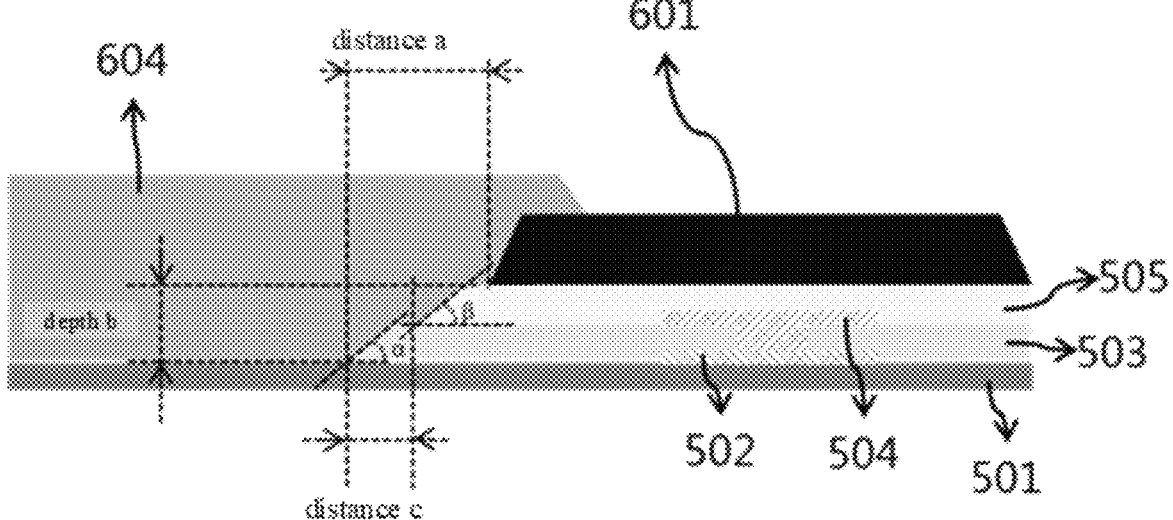
FIG. 5 schematically shows a schematic sectional structural diagram of yet another first slot according to the present disclosure.
Figure 6:
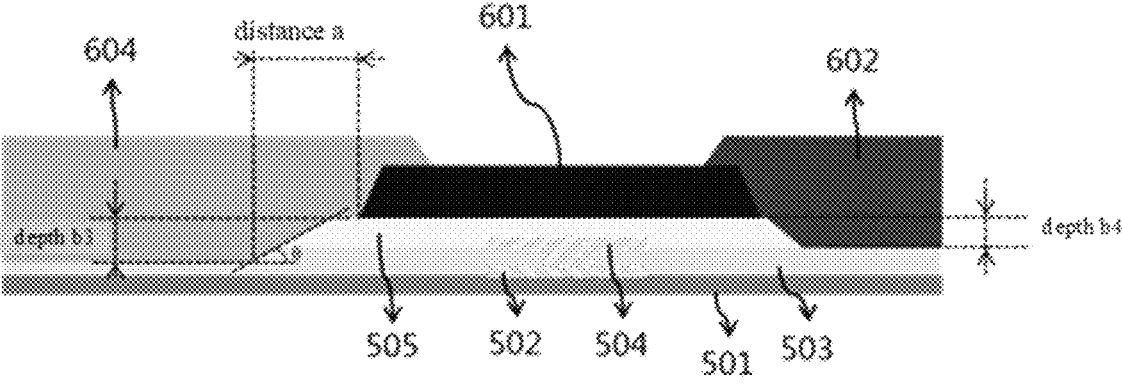
FIG. 6 schematically shows a schematic sectional structural diagram of another light filtering structure according to the present disclosure.
Figure 7:
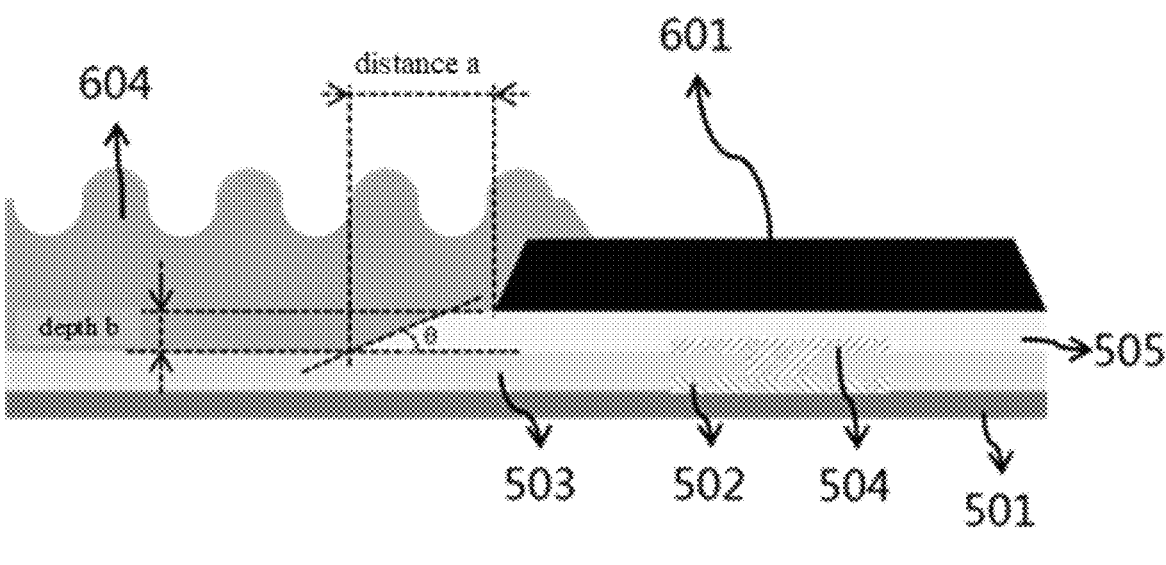
FIG. 7 schematically shows a schematic sectional structural diagram of another display panel according to the present disclosure.
Figure 8:
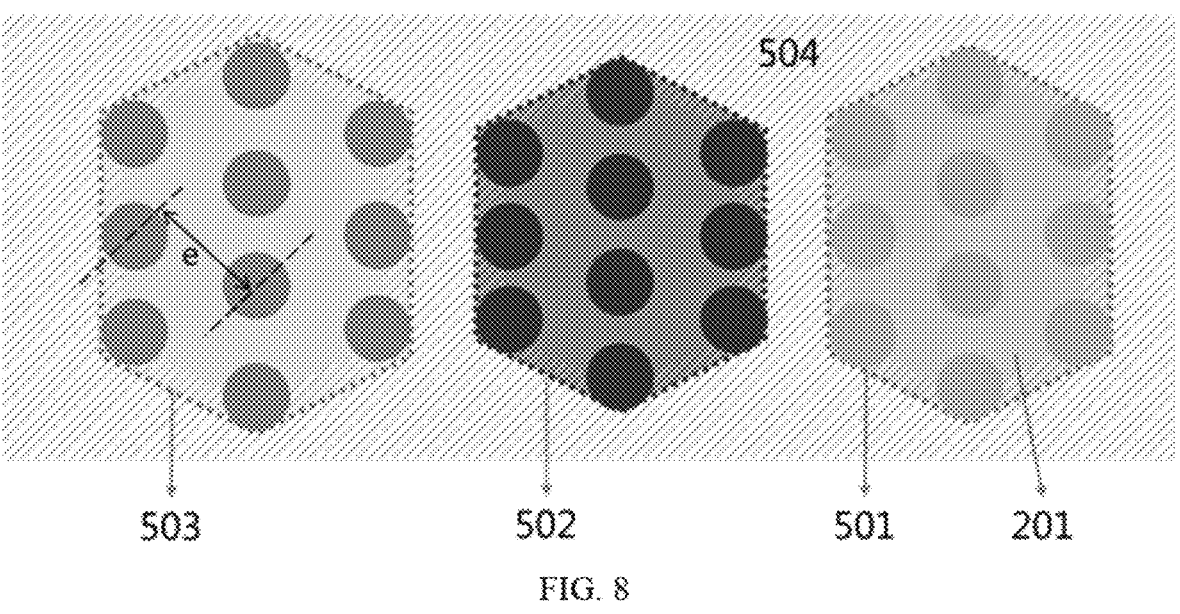
FIG. 8 schematically shows a schematic structural diagram of the front face of a light filtering structure according to the present disclosure.

In order to solve the above problems, the present disclosure provides a display panel. Referring to FIG. 1, FIG. 1 schematically shows a schematic sectional structural diagram of a display panel according to the present disclosure. As shown in FIG. 1, the display panel includes:

a displaying substrate, including at least one light emitting region and a non-light emitting region; and a color light filtering layer disposed on the light exiting side of the displaying substrate, wherein the color light filtering layer includes a plurality of light filtering structures, and the orthographic projections of the light filtering structures on the displaying substrate cover corresponding positions of the light emitting region.

Optionally, the displaying substrate may be an organic luminescent displaying substrate. The light emitting regions according to the present disclosure are pixel light emitting regions, each of the light emitting regions may correspond to the light emitting region where one pixel point is located, and the light emitting region may be treated by using one light filtering structure of the corresponding color. As an example, the light emitting region of a red-color pixel point may be treated by using a red-color light filtering structure transmitting red light. The non-light emitting region according to the present disclosure may refer to the region of the displaying substrate other than the light emitting region.

The minimum distance between the boundary of the orthographic projection of the light filtering structure on the displaying substrate and the boundary of the corresponding position of the light emitting region may be larger than or equal to 0 μm, and less than or equal to 10 μm, so as to ensure that the light filtering structure can treat the corresponding pixel light.

The plurality of light filtering structures include a first light filtering structure 603 and a second light filtering structure 602, the thickness of the first light filtering structure 603 and the thickness of the second light filtering structure 602 are different, and the surface of the first light filtering structure 603 at one side away from the displaying substrate and the surface the second light filtering structure 602 at one side away from the displaying substrate are in the same plane.

The thicknesses of the first light filtering structure 603 and the second light filtering structure 602 may be determined according to the light transmittances of the respective light filtering materials and the luminous efficiency of the luminescent material within the corresponding light emitting region, with the goal that the exiting-light intensity of the first light filtering structure 603 and the exiting-light intensity of the second light filtering structure 602 are equal. As an example, the filtered-light color of the first light filtering structure 603 may be the green color, and the filtered-light color of the second light filtering structure 602 may be the red color. When the light transmittances of the first light filtering structure 603 and the second light filtering structure 602 are equal, the luminous efficiency of the green-color light emitting region corresponding to the first light filtering structure 603 is larger than the luminous efficiency of the red-color light emitting region corresponding to the second light filtering structure 602. Accordingly, in order to enable the exiting-light intensity of the first light filtering structure 603 and the exiting-light intensity of the second light filtering structure 602 to be equal, it should be configured that the thickness of the first light filtering structure 603 is larger than the thickness of the second light filtering structure 602, so as to reduce the light transmittance of the first light filtering structure 603, to balance the exiting-light intensity of the first light filtering structure 603 and the exiting-light intensity of the second light filtering structure 602.

Taking into consideration that, in the RGB three-primary-color light-emission technique, at least two luminescent materials have unequal luminous efficiencies, and it is required to provide at least two differentiated thicknesses, the present disclosure provides the first light filtering structure 603 and the second light filtering structure 602 of the unequal thicknesses. In an aspect, that enables the light-intensity difference caused by the unequal luminous efficiencies to be balanced, to ameliorate or even eliminate the problems such as color cast, and, because the surface of the first light filtering structure 603 at one side away from the displaying substrate and the surface of the second light filtering structure 602 at one side away from the displaying substrate are in the same one plane, the light-exiting face of the color light filtering layer maintains flush. In another aspect, that can prevent color separation caused by an uneven light-filtering light-exiting face, and the problems such as divergence and interference by the external ambient light, thereby reducing the reflectivity of the external-environment light, to improve the dark-state effect of the product. Because the film thicknesses of the light filtering structures in the color light filtering layer are emphatically adjusted, by disposing the light filtering structures of the unequal film thicknesses, a displaying device having an excellent visual angle, a low reflectivity, a high power consumption yield and a good effect of color separation can be obtained.

In order to correspond to the light emitting regions of the luminescent materials of three colors, in an alternative embodiment, the present disclosure further provides light filtering structures, wherein the plurality of light filtering structures further include a third light filtering structure 604.

The surface of the first light filtering structure 603 at one side away from the displaying substrate, the surface of the second light filtering structure 602 at one side away from the displaying substrate and the surface of the third light filtering structure 604 at one side away from the displaying substrate are in the same plane.

Considering the case in which all of the luminous efficiencies of the luminescent materials of three colors are different, all of the thicknesses of the first light filtering structure 603, the second light filtering structure 602 and the third light filtering structure 604 may be unequal.

Optionally, in an alternative embodiment, the filtered-light colors of the light filtering structures are the same as the emitted-light colors of the corresponding positions of the light emitting region, and the thicknesses of the light filtering structures are positively correlated with the luminous efficiencies of the corresponding positions of the light emitting region.

Particularly, the first light filtering structure may correspond to a first light emitting region, the second light filtering structure may correspond to a second light emitting region, and the third light filtering structure may correspond to a third light emitting region.

The light emitting region may include an electroluminescent organic light emitting component, and accordingly the luminous efficiency of the light emitting region may refer to the luminous efficiency of the material of the organic light emitting component. If the luminous efficiency of the material of the organic light emitting component of a certain sub-pixel is higher, the color light of the sub-pixel emitted by the organic light emitting component is more intensive. Moreover, if the thickness of the light filtering structure is higher, the transmittance is lower, and it can filter and weaken the color light that is more intensive than the color lights of the other sub-pixels, to cause the proportion of the light intensities of the color lights to satisfy the requirement, to satisfy the requirement of watching of the displayed frames by naked eyes.

As an example, if the filtered-light color of the light filtering structure is the red color, then the emitted-light color of the corresponding position of the light emitting region is also the red color. If the green-color light emitting region has the highest luminous efficiency, then the light filtering structure whose filtered-light color is the green color has the highest thickness.

In an alternative embodiment, the thickness of the first light filtering structure 603 is larger than the thickness of the second light filtering structure 602, and the thickness of the second light filtering structure 602 is larger than or equal to the thickness of the third light filtering structure 604.

Particularly, among the organic luminescent materials, the green-color luminescent material usually has the highest luminous efficiency, and the luminous efficiency of the red-color luminescent material is usually slightly larger than or equal to the luminous efficiency of the blue-color luminescent material. Therefore, the filtered-light color of the first light filtering structure 603 may be the green color, the filtered-light color of the second light filtering structure 602 is the red-color, and the filtered-light color of the third light filtering structure 604 is the blue-color. It has been proved by experimentation that, by disposing the light filtering structures with the corresponding sizes according to the above embodiments, the light-intensity efficiency that has undergone light-filtering treatment of the blue-color light emitting device of the lowest luminous efficiency can be increased by 10%, and the overall reflectivity of the displaying-device product can be reduced by at least 0.2%.

In the above embodiment, the light filtering structures in the color light filtering layer perform selective passing of the color lights with respect to the corresponding light emitting regions. In order to prevent disordering of the optical paths of the color lights, it is required to block the non-pixel light emitting region. Accordingly, in an alternative embodiment, the present disclosure further provides a display panel, wherein the display panel includes a black matrix 601 disposed in the same layer as the color light filtering layer, and the orthographic projection of the black matrix 601 on the displaying substrate is located within the non-light emitting region.

That the black matrix 601 is disposed in the same layer as the color light filtering layer refers to that the stacking position of the black matrix 601 is the same as that of the color light filtering layer, and does not limit the thickness of the black matrix 601. Optionally, in order to facilitate the disposing of the light filtering structures, the width of the face of the black matrix 601 away from the displaying substrate may be less than the width of the face of the black matrix 601 close to the displaying substrate, to form a trapezoidal cross section.

In the present disclosure, it is also considered to integrate other functional layers in the color light filtering layer that has been provided with the differentiated thicknesses, to be used to embed the light filtering structures. Accordingly, in an alternative embodiment, the present disclosure further provides a display panel, wherein the display panel includes a functional film layer disposed between the displaying substrate and the color light filtering layer, a first slot is disposed at the surface of the functional film layer at one side close to the color light filtering layer. and the first light filtering structure 603 fills the first slot.

As an example, the functional film layer may include a touch control functional layer. Accordingly, the first slot may be disposed downwardly from the surface of the touch control functional layer in an insulating layer 503 and a buffer layer 501 of the touch control functional layer.

The processing mode, the size and the position of the first slot may be related to the material property and the thickness of the functional film layer. As an example, if the functional film layer is a purely inorganic material, it may be processed by etching. If the functional film layer is an organic material, it may be processed by exposure and development. If the material of the functional film layer that can be grooved is thick, then the first slot may be configured thicker.

By using the above embodiment, in the functional film layer integrated in the display panel, the first slot is configured to place the first light filtering structure 603, whereby different light filtering structures can be further placed in an embedding and sinking mode with different depths, which does not only realize the differentiated thickness of the light filtering structures, but also can effectively reduce the thickness of the display panel.

In order to enable the first light filtering structure 603 filling the first slot to smoothly send the light emitted by the corresponding light emitting region to the place, and not mix up with the optical paths of the other light filtering structures, in an alternative embodiment, the present disclosure further provides a first slot, wherein the angle of gradient of a side wall of the first slot is larger than or equal to 20°, and less than or equal to 90°; and/or the minimum distance between the boundary of the orthographic projection of the bottom face of the first slot on the displaying substrate and the boundary of the orthographic projection of the black matrix 601 on the displaying substrate is larger than or equal to −2 μm, and less than or equal to 10 μm; and/or the depth of the first slot is larger than or equal to 0.1 μm, and less than or equal to 2.4 μm.

It should be noted that the "A and/or B and/or C" in the embodiments of the present disclosure includes at least any one of "A", "B" and "C", and may particularly include the seven cases of "A and B and C", "A and B", "B and C", "A and C", "A", "B", and "C".

As an example, the angle of gradient of a side wall of a first slot may be larger than or equal to 20°, and less than or equal to 90°. Moreover, the depth of the first slot may be larger than or equal to 0.1 µm, and less than or equal to 2.4 µm.

Further optionally, the angle of gradient of the side wall of the first slot may be 60°.

Further optionally, the minimum distance between the boundary of the orthographic projection of the bottom face of the first slot on the displaying substrate and the boundary of the orthographic projection of the black matrix 601 on the displaying substrate may be 2 µm.

Further optionally, the depth of the first slot may be 2 µm.

The depth of the first slot does not exceed the overall thickness of the functional film layer.

Given that the thickness of the second light filtering structure 602 and the thickness of the second light filtering structure 602 may be less than the thickness of the first light filtering structure 603, when the first light filtering structure 603 has been disposed in the slot, the second light filtering structure 602 may not be required to be disposed in the slot. Accordingly, in an alternative embodiment, the present disclosure further provides a display panel, wherein the second light filtering structure 602 is disposed on the surface of the functional film layer at one side close to the color light filtering layer.

If all of the luminous efficiencies of the three light emitting regions are different, then it is considered that the thickness of the second light filtering structure 602 should be unequal to the thickness of the third light filtering structure 604, and the second light filtering structure 602 may be disposed in the slot. Accordingly, in an alternative embodiment, the present disclosure further provides a display panel, wherein a second slot is disposed at the surface of the functional film layer at one side close to the color light filtering layer, the second light filtering structure 602 fills the second slot, and the depth of the second slot is less than the depth of the first slot.

By using the above embodiment, both of the second slot and the first slot are opened at the surface of the functional film layer at one side close to the color light filtering layer; in other words, the openings of the slots are in the same plane, and the depth of the second slot is less than the depth of the first slot. Therefore, the differentiation of the thicknesses of the first light filtering structure 603 and the second light filtering structure 602 can be realized while the light-exiting faces of the first light filtering structure 603 and the second light filtering structure 602 flush.

In order to enable the second light filtering structure 602 filling the second slot to smoothly send the light emitted by the corresponding light emitting region to the place, and not mix up with the optical paths of the other light filtering structures, in an alternative embodiment, the present disclosure further provides a second slot, wherein the angle of gradient of a side wall of the second slot is larger than or equal to 20°, and less than or equal to 90°.

Additionally or alternatively, the distance between the boundary of the orthographic projection of the bottom face of the second slot on the luminescent layer and the boundary of the orthographic projection of the black matrix 601 on the luminescent layer is larger than or equal to −2 µm, and less than or equal to 10 µm.

Additionally or alternatively, the depth of the second slot is larger than or equal to 0.1 µm, and less than or equal to 2.4 µm.

Further optionally, the angle of gradient of a side wall of the first slot may be 60°.

Further optionally, the minimum distance between the boundary of the orthographic projection of the bottom face of the first slot on the displaying substrate and the boundary of the orthographic projection of the black matrix 601 on the displaying substrate may be 2 µm.

Further optionally, the depth of the first slot may be 1 µm.

The depth of the second slot does not exceed the overall thickness of the functional film layer.

As similar to the second light filtering structure 602 in the above embodiment, the third light filtering structure 604 may not be required to be disposed in the slot. Accordingly, in an alternative embodiment, the present disclosure further provides a display panel, wherein the third light filtering structure 604 is disposed on the surface of the functional film layer at one side close to the color light filtering layer.

In order to thin the display panel, and ensure the effect of the light filtration by the light filtering structures, the third light filtering structure 604 may be disposed in the slot in an embedding manner. Accordingly, in an alternative embodiment, the present disclosure further provides a display panel, wherein a third slot is disposed at the surface of the functional film layer at one side close to the color light filtering layer, the third light filtering structure 604 fills the third slot, and the depth of the third slot is less than or equal to the depth of the second slot.

In an alternative embodiment, the present disclosure further provides a functional film layer, wherein the functional film layer is a touch control functional layer, and the touch control functional layer includes at least one of a buffer layer 501 arranged in layer configuration, a first touch electrode 502 layer, an insulating layer 503, a second touch electrode 504 layer and a first planarization layer 505.

The first touch electrode 502 layer and the second touch electrode 504 layer may be disposed in the insulating layer 503 and the first planarization layer 505 in an embedding manner. Accordingly, the region where the touch electrode is located may be configured to the corresponding non-light emitting region, so as to avoid embedding the light filtering structures in the first planarization layer 505, or the first planarization layer 505 or the insulating layer 503, or the insulating layer 503 and the buffer layer 501, within the region where the touch electrode is located.

The buffer layer 501, the first touch electrode 502 layer, the insulating layer 503, the second touch electrode 504 layer and the first planarization layer 505 may be sequentially arranged in layer configuration in the direction away from the displaying substrate.

The first touch electrode 502 layer includes a first touch electrode 502, the second touch electrode 504 layer includes a second touch electrode 504, and the first touch electrode 502 and the second touch electrode 504 are connected by a via hole disposed in the insulating layer 503.

Optionally, the first touch electrode 502 may be a touch connecting electrode, and may be located on the side close to the displaying substrate. Correspondingly, the second touch electrode 504 may be located on the side away from the displaying substrate.

In order to further, by using the light filtering structures, reduce the reflectivity of the external-environment light, and improve the effect of divergence of the filtered light, in an alternative embodiment, the present disclosure further provides light filtering structures, wherein at least one protruding structure is disposed at the surface of each of the light filtering structures at one side away from the displaying substrate, and the protruding structure is for diverging light emitted by the respective corresponding positions of the light emitting region.

Optionally, in an alternative embodiment, the protruding structure is a hemispherical prism, and the orthographic projection of the protruding structure on the displaying substrate is a circle.

The surface of the hemispherical prism at one side away from the displaying substrate may be an arc-shaped face, and, further, may be a standard hemispherical arc-shaped face, to adapt for different demands of light-ray divergence.

By using the above embodiment, by changing the light filtering structures into the prism structure, the light rays from the lower part of the displaying substrate can be separated, whereby the light rays on the side faces of the light filtering structures are supplemented, the L-decay effect is optimized, and the visual angle of the displaying-device product can be improved.

Furthermore, by using the above embodiment, by changing the light filtering structures into the prism structure, because the visual angle is optimized, the organic film thickness in the thin-film packaging can be increased, which can reduce the signal-to-noise ratio, and improve the touch effect of flexible multi-layer on cell (FMLOC).

Optionally, the diameter of the circle is larger than or equal to 1 μm, and less than or equal to 10 μm; and/or the spacing between the circle centers of a plurality of circles is larger than or equal to 1 μm, and less than or equal to 20 μm.

In an alternative embodiment, the at least one protruding structure includes a plurality of protruding structures, and the plurality of protruding structures are distributed in a polygonal array corresponding to the light emitting region of the displaying substrate.

Particularly, each of the independent light filtering structures may correspond to one of the light emitting regions, and accordingly the polygonal array formed by the plurality of protruding structures on the independent light filtering structures can correspond to one light emitting region of the displaying substrate.

Further, taking into consideration the sizes of the pixel light emitting regions in the related art, in order to set the light filtering structures adapting for the sizes, in an alternative embodiment, the present disclosure further provides a protruding structure, wherein the height of the protruding structure is larger than or equal to 0 μm, and less than or equal to 4 μm.

Moreover, taking into consideration the effect of the light filtration by the light filtering structures, and in order to facilitate the thickness differentiation, the present disclosure further provides light filtering structures, wherein the maximum thickness of the light filtering structures is larger than or equal to 2 μm, and less than or equal to 10 μm.

Accordingly, it may also be configured that the difference between the thickness of the light filtering structures and the height of the protruding structure is larger than or equal to 2 μm, and less than or equal to 10 μm.

Optionally, all of the first light filtering structure 603, the second light filtering structure 602 and the third light filtering structure 604 may employ a protruding prism structure having a certain rule, and the plurality of prisms on the same one independent light filtering structure may be distributed, according to the shape of each of the pixel light emitting regions, in a tetragonal, hexagonal or polygonal array.

Referring to the above embodiments, in order to enable the light filtering structures to adapt for the size structure and the material of the display panel, considering the case in which merely the first slot in provided, in an alternative embodiment, the present disclosure further illustratively provides a display panel:

In the display panel, the buffer layer 501 and the insulating layer 503 may employ an inorganic material, and the thicknesses may be larger than or equal to 0.1 μm, and less than or equal to 0.5 μm. The first planarization layer 505 may employ an organic material, and the thickness may be larger than or equal to 0.1 μm, and less than or equal to 10 μm.

The first slot of the first planarization layer 505 may be formed by exposure and development.

In the color light filtering layer, the first light filtering structure 603 may be the mere component that is disposed in the first slot. Therefore, the first slot may be disposed merely within the green-color light emitting region, and the second light filtering structure 602 and the third light filtering structure 604 have equal thicknesses.

The difference between the thickness of the first light filtering structure 603 and the thicknesses of the second light filtering structure 602 and the third light filtering structure 604 may be 0.1-2 μm.

Particularly, the depth of the first slot may be 0.1-2 μm.

It should be noted that, in order to clarify the definition, the expression with respect to "a numerical value A-a numerical value B" in the present disclosure refers to the numerical-value range including the numerical value A and the numerical value B; in other words, it is equivalent to the numerical-value range larger than or equal to the numerical value A and less than or equal to the numerical value B.

Considering the case in which the first slot and the second slot are provided, in another alternative embodiment, the present disclosure further illustratively provides a display panel:

In the display panel, the buffer layer 501 and the insulating layer 503 may employ an inorganic material, and the thicknesses may be larger than or equal to 0.1 μm, and less than or equal to 0.5 μm. The first planarization layer 505 may employ an organic material, and the thickness may be larger than or equal to 0.1 μm, and less than or equal to 10 μm.

The first slot of the first planarization layer 505 may be formed by exposure and development.

In the color light filtering layer, the first light filtering structure 603 may be the mere component that is provided in the first slot. Furthermore, the second light filtering structure 602 is disposed in the second slot. Therefore, the first slot may be disposed within the green-color light emitting region, the second slot may be disposed within the light emitting region of the red-color second light filtering structure 602, the thickness of the first light filtering structure 603 is larger than the thickness of the second light filtering structure 602, and the thickness of the second light filtering structure 602 is larger than the thickness of the third light filtering structure 604.

The difference between the thickness of the first light filtering structure 603 and the thickness of the second light filtering structure 602 may be 0.1-2 μm. The difference between the thickness of the second light filtering structure 602 and the thickness of the third light filtering structure 604 may be 0.1-2 μm.

Particularly, the depth of the first slot may be 0.5-2 μm, the depth of the second slot may be 0.1-2 μm, and the thickness difference between the depth of the first slot and the depth of the second slot may be 0.1-2 μm.

Considering the case in which the first planarization layer 505 is omitted, in another alternative embodiment, the present disclosure further illustratively provides a display panel:

In the display panel, the buffer layer 501 and the insulating layer 503 may employ an inorganic material, and the thicknesses may be larger than or equal to 0.1 µm, and less than or equal to 0.5 µm.

The slot is formed by etching on the insulating layer 503, or on the buffer layer 501 and the insulating layer 503. The angle of gradient θ formed by the slot is between 20°-90°, and preferably the angle is 60°. The distance a between the edge of the slot and the structure 601 is between –2-10 µm, and preferably the distance is 2 µm. The depth b of the slot is between 0.1-1.6 µm, and preferably the depth is 1.0 µm.

In the color light filtering layer, the first light filtering structure 603 may be the mere component that is disposed in the first slot. Therefore, the first slot may be disposed merely within the green-color light emitting region, and the second light filtering structure 602 and the third light filtering structure 604 have equal thicknesses. The difference between the thickness of the first light filtering structure 603 and the thicknesses of the second light filtering structure 602 and the third light filtering structure 604 may be 0.1-1.6 µm. Particularly, the depth of the first slot may be 0.1-1.6 µm.

Considering the case in which the first planarization layer 505 is also an inorganic material, in another alternative embodiment, the present disclosure further illustratively provides a display panel:

In the display panel, the first planarization layer 505, the buffer layer 501 and the insulating layer 503 may employ an inorganic material, and the thicknesses may be larger than or equal to 0.1 µm, and less than or equal to 0.8 µm.

The fabrication of the slot on the first planarization layer 505, the buffer layer 501 and the insulating layer 503 may include two steps of etching. The film layer etched the first time is the insulating layer 503, or the buffer layer 501 and the insulating layer 503, and the film layer etched the second time is the first planarization layer 505. Because of the two-step etching, the distance c between the edges of the slots etched the first time and etched the second time is between –10-10 µm.

In order to planarize the light-exiting face of the display panel, and perform planarizing protection to the color light filtering layer, in an alternative embodiment, the display panel may further include a second planarization layer 605 located on the side of the color light filtering layer away from the luminescent layer.

Furthermore, in order to perform packaging protection to the displaying substrate and facilitate to realize the planarization of the light-exiting face of the displaying substrate, in an alternative embodiment, the display panel may further include a packaging layer 400 located between the color light filtering layer and the displaying substrate.

By referring to the above embodiments, on the basis of the similar inventive concept, an embodiment of the present disclosure further provides a displaying device, wherein the displaying device includes the display panel according to any one of the above embodiments.

Referring to FIG. 16, FIG. 16 is a flow chart of the steps of a manufacturing method according to an embodiment of the present disclosure. As shown in FIG. 16, by referring to the above embodiments, on the basis of the similar inventive concept, an embodiment of the present disclosure further provides a manufacturing method, wherein the method includes:

Step S301: providing a displaying substrate, wherein the displaying substrate includes at least one light emitting region and a non-light emitting region.

Step S302: forming a color light filtering layer at a light exiting side of the displaying substrate, wherein the color light filtering layer includes a plurality of light filtering structures, and orthographic projections of the light filtering structures on the displaying substrate cover corresponding positions of the light emitting region.

The plurality of light filtering structures include a first light filtering structure 603 and a second light filtering structure 602, the thickness of the first light filtering structure 603 and the thickness of the second light filtering structure 602 are different, and the surface of the first light filtering structure 603 at one side away from the displaying substrate and the surface of the second light filtering structure 602 at one side away from the displaying substrate are in the same plane.

In an alternative embodiment, the present disclosure further provides a method for forming the color light filtering layer, wherein the method includes:

Step S401: forming a functional film layer on the light exiting side of the displaying substrate.

Step S402: performing exposure and development and/or etching to a surface of the functional film layer at one side away from the displaying substrate, to obtain a first slot.

Step S403: forming the color light filtering layer at the one side of the functional film layer away from the displaying substrate, wherein the first light filtering structure 603 fills the first slot.

Optionally, in an alternative embodiment, the present disclosure further provides an example of the method for manufacturing the display panel:

Step 501: on a rigid transparent substrate 10, by methods such as exposure, development, magnetron sputtering, dry etching and wet etching, forming a thin-film-transistor component in an active-matrix light-emitting-diode displaying device, i.e., a flexible thin-film-transistor circuit 20. The flexible thin-film-transistor circuit 20 obtained by using the above process step is a thin-film-transistor component having the current-voltage regulating function. The rigid transparent substrate 10 may be a transparent alkali-free glass or quartz substrate, or another transparent substrate having a certain hardness.

Step 502: on the flexible thin-film-transistor circuit 20, by methods such as magnetron sputtering, exposure and development, and etching, forming a first electrode 201 whose thickness may be 10-1000 nm. The material of the first electrode 201 may be a metal of a high reflectivity, such as silver Ag, gold Au, palladium Pd and platinum Pt, or an alloy or stack of such a type of metals. The first electrode 201 may also be a composite film layer of indium tin oxide ITO and a metal reflecting layer.

Step 503: on the first electrode 201, coating, exposing and developing a photoresist of the thickness of 0.5-1.5 µm, to fabricate a pixel definition layer 202 having a regular arrangement, to define the subsequent filling of a luminescent material.

Step 504: on the pixel definition layer 202, coating a photoresist of the thickness of 0.5-1.5 µm, and subsequently performing exposure and development, to fabricate a separating and supporting layer 203 having a regular arrangement, which is used to support the identifier used during the vapor deposition of electro luminescence (EL), to reduce the possibility that the filling of the luminescent material deviates. The separating and supporting layer 203 may be replaced by the pixel definition layer 202. The photoresist used for manufacturing the pixel definition layer 202 or the separating and supporting layer 203 may be a transparent material or a black non-transparent material.

Step 505: by at least one of vacuum high-temperature vapor deposition, ink-jet printing and transfer printing, filling red-color luminescent layer (R-EL), green-color light emitting region (G-EL) and blue-color light emitting region (B-EL) into the corresponding pixel definition layer 202, and performing the subsequent filling of the film layers of an EL device. The EL device includes a hole injection layer, a hole transporting layer, an electron blocking layer, a hole blocking layer, an electron transporting layer, an electron injection layer and so on.

Step 506: after the vapor deposition of the luminescent layers has been completed, by using a metal such as silver Ag, magnesium Mg and aluminum Al or a metal oxide material, manufacturing a second electrode 304 that has a film thickness of 1-30 nm and has a certain transmittance. The first electrode 201 and second electrode 304 cooperate to regulate the state of the luminescent layers and regulate the effect of displaying of the product.

Step 507: by methods such as plasma enhanced chemical vapor deposition (PECVD), chemical vapor deposition (CVD), atomic layer deposition (ALD) and hexamethyldisiloxane (HDMSO) electrodeposition, forming an inorganic thin film with the film thickness of 0.1-5.0 μm, i.e., the first packaging layer 401400 in the packaging layer 400. The film material of the formed film may be one or a stack of two or more of silicon oxynitride SiOxNy, silicon nitride SiNx, silicon oxide SiOx and aluminium oxide AlOx.

Step 508: by using a high-transparency organic material that can be thermally solidified or optically solidified, such as acrylates and epoxy resins, manufacturing a second packaging layer 402400 in the packaging layer 400, to alleviate the stress of the inorganic layer and protect the color light filtering layer. The filling of the organic material may be performed by blade coating, ink-jet printing and so on, and the film thickness may be set to be 0.1-50.0 μm. Subsequently thermal solidification or optical solidification is performed, to complete the solidification of the organic resin material.

Step 509: by methods such as Plasma Enhanced Chemical Vapor Deposition, Chemical Vapor Deposition, Atomic Layer Deposition and electrodeposition, forming an inorganic thin film of the film thickness of 0.1-2.0 μm, i.e., a third packaging layer 403400 in the packaging layer 400. The film material of the formed film may be one or a stack of two or more of SiOxNy, SiNx, SiOx and AlOx.

Accordingly, the packaging layer 400 is obtained. Merely the packaging layer 400 of a three-layer packaging structure is described herein, and, in practice, that may be expanded into a multilayer inorganic-organic tandem packaging structure.

Step 510: by methods such as PECVD, CVD, HDMSO, spread coating, and printing, forming a buffer layer 501 of the film thickness of 0.1-5.0 μm, i.e., the buffer layer 501. The material of the buffer layer 501 may be one or a stack or mixture of two or more of the organic materials of SiOxNy, SiNx, SiOx, AlOx, an acrylic resin and an epoxy resin. When the film material of the buffer layer 501 is an inorganic material, it may be replaced by a thickened third packaging layer 403400, thereby reducing the manufacture procedure, and reducing the product cost.

Step 511: by methods such as magnetron sputtering, manufacturing one or more of a metal such as silver Ag, gold Au, palladium Pd and platinum Pt or a metal oxide such as indium tin oxide ITO into a first touch electrode 502 in which the materials are stacked or mixed. The first touch electrode 502 may be a touch connecting electrode, and its orthographic projection on the rigid transparent substrate 10 is located within the area of the orthographic projection of the pixel definition layer 202 on the rigid transparent substrate 10. The thickness of the touch connecting electrode is 10-500 nm.

Step 512: on the component obtained in the above step, by methods such as PECVD, CVD, HDMSO, spread coating, and printing, forming an insulating layer 503 with the film thickness of 0.1-5.0 μm. The insulating layer 503 is provided with a plurality of via holes, and the via holes expose the surface of the touch connecting electrode 502. In the fabrication of the via holes, the positions corresponding to the green-color light emitting regions are simultaneously etched, to form the slots matching with the green-color light emitting regions on the buffer layer 501, and the minimum distance between the slots and the light emitting regions may be 0-10 μm.

Step 513: by methods such as magnetron sputtering. manufacturing one or more of a metal such as silver Ag, gold Au, palladium Pd and platinum Pt or a metal oxide such as indium tin oxide ITO into a second touch electrode 504 in which the materials are stacked or mixed. The thickness of the second touch electrode 504 is 10-500 nm. The second touch electrode 504 is uniformly deposited at the surface of the insulating layer 503, and some parts of the second touch electrode 504 are connected to the first touch connecting electrode 502 by the via holes in the insulating layer 503.

Step 514: optionally, planarizing by using a high-transparency organic material, to obtain a first planarization layer 505. The selected high-transparency organic material may be an organic material that can be thermally solidified or optically solidified, such as acrylates and epoxy resins. The filling of the organic material may be performed by blade coating, ink-jet printing and so on, and the thickness of the first planarization layer 505 may be 0.1-50.0 μm.

Step 515: by using a negative photoresist, performing spread coating, exposure and development, to fabricate a layer of a black matrix 601. The black matrix 601 covers the same area as that covered by the pixel definition layer 202, and the distance between the boundary of the black matrix 601 and the boundary of the pixel definition layer 202 is −2-10 μm. This step may also include, by using an organic resin material containing a thermal curing agent or light-sensitive curing agent, performing ink-jet printing or transfer printing, and completing the corresponding material solidification, to form the black matrix 601.

Step 516: by using a negative photoresist, performing spread coating, exposure and development, to sequentially form a red-color color film, a green-color color film and a blue-color color film, i.e., the second light filtering structure 602, the first light filtering structure

603 and the third light filtering structure 604, or manufacturing the light filtering structures by using a changed RGB process sequence. The red-color color film covers the same area as that covered by the red-color luminescent layer, the blue-color color film covers the same area as that covered by the green-color light emitting region, and the green-color color film covers the same area as that covered by the blue-color light emitting region. The orthographic projections on the rigid transparent substrate 10 of the boundaries of the color films and the orthographic projection on the rigid transparent substrate 10 of the boundary of the pixel definition layer 202 have a distance of 0-10 µm therebetween.

Step 517: after the color light filtering layer and the black matrix 601 have been completely fabricated, planarizing by using a high-transparency organic material, to obtain a second planarization layer 605. The selected high-transparency organic material may be an organic material that can be thermally solidified or optically solidified, such as acrylates and epoxy resins. The filling of the organic material may be performed by blade coating, ink-jet printing and so on, and the film thickness is set to be 0.1-50.0 µm. That film layer may also be selectively omitted. The second planarization layer 605 is described merely as a planarization functional layer herein, and the second planarization layer 605 may be expanded as an inorganic stacked layer or organic-inorganic stacked layer having the function of reducing the reflectivity.

By using the above-described embodiments, the present disclosure realizes the following advantages:

(1) The present disclosure realizes thickness differentiation of the light filtering structures in the color light filtering layer, and at the same time ensures that the upper surfaces of the film layers are in the same plane. Therefore, that does not only enable the thicknesses of the light filtering structures to adapt for the luminous efficiencies of the corresponding light emitting regions, to equalize the intensities of the color lights, but also reduces the reflectivity of the light filtering structures to the external ambient light.

(2) The present disclosure can etch within the region of the vapor deposition of electroluminescence for the FMLOC non-metallic film layer, and fill by using the filling technique of the color light filtering layer, which realizes thickness differentiation of the light filtering structures.

(3) The light filtering structures using the lens protruding structures are fabricated, to diverge the light rays, which further reduces the emissivity of the color light filtering layer, and optimizes the visual angle.

It should be noted that the manufacturing method may further include more steps, which may be determined according to practical demands, and is not limited in the present disclosure. The detailed description on and the technical effects of the displaying device obtained by using the manufacturing method may refer to the above description on the displaying device, and are not discussed herein further.

The embodiments of the description are described in the mode of progression, each of the embodiments emphatically describes the differences from the other embodiments, and the same or similar parts of the embodiments may refer to each other.

Finally, it should also be noted that, in the present text, relation terms such as first and second are merely intended to distinguish one entity or operation from another entity or operation, and that does not necessarily require or imply that those entities or operations have therebetween any such actual relation or order. Furthermore, the terms "include", "comprise" or any variants thereof are intended to cover non-exclusive inclusions, so that processes, methods, articles or devices that include a series of elements do not only include those elements, but also include other elements that are not explicitly listed, or include the elements that are inherent to such processes, methods, articles or devices. Unless further limitation is set forth, an element defined by the wording "including a . . . " does not exclude additional same element in the process, method, article or device including the element.

The display panel, the manufacturing method, and the displaying device according to the present disclosure have been described in detail above. The principle and the embodiments of the present disclosure are described herein with reference to the particular examples, and the description of the above embodiments is merely intended to facilitate to understand the method according to the present disclosure and its core concept. Moreover, for a person skilled in the art, according to the concept of the present disclosure, the particular embodiments and the range of application may be varied. In conclusion, the contents of the description should not be understood as limiting the present disclosure.

A person skilled in the art, after considering the description and implementing the invention disclosed herein, will readily envisage other embodiments of the present disclosure. The present disclosure aims at encompassing any variations, uses or adaptative alternations of the present disclosure, wherein those variations, uses or adaptative alternations follow the general principle of the present disclosure and include common knowledge or common technical means in the art that are not disclosed by the present disclosure. The description and the embodiments are merely deemed as exemplary, and the true scope and spirit of the present disclosure are presented by the following claims.

It should be understood that the present disclosure is not limited to the accurate structure that has been described above and shown in the drawings, and may have various modifications and variations without departing from its scope. The scope of the present disclosure is merely limited by the appended claims.

The "one embodiment", "an embodiment" or "one or more embodiments" as used herein means that particular features, structures or characteristics described with reference to an embodiment are included in at least one embodiment of the present disclosure. Moreover, it should be noted that here an example using the wording "in an embodiment" does not necessarily refer to the same one embodiment.

The description provided herein describes many concrete details. However, it can be understood that the embodiments of the present disclosure may be implemented without those concrete details. In some of the embodiments, well-known processes, structures and techniques are not described in detail, so as not to affect the understanding of the description.

In the claims, any reference signs between parentheses should not be construed as limiting the claims. The word "include" does not exclude elements or steps that are not listed in the claims. The word "a" or "an" preceding an element does not exclude the existing of a plurality of such elements. The present disclosure may be implemented by means of hardware including several different elements and by means of a properly programmed computer. In unit claims that list several devices, some of those devices may be embodied by the same item of hardware. The words first, second, third and so on do not denote any order. Those words may be interpreted as names.

Finally, it should be noted that the above embodiments are merely intended to explain the technical solutions of the present disclosure, and not to limit them. Although the present disclosure is explained in detail with reference to the above embodiments, a person skilled in the art should understand that he can still modify the technical solutions set forth by the above embodiments, or make equivalent substitutions to part of the technical features of them. However, those modifications or substitutions do not make the essence of the corresponding technical solutions depart from the spirit and scope of the technical solutions of the embodiments of the present disclosure.

The invention claimed is:

1. A display panel, comprising:
   a displaying substrate, comprising at least one light emitting region and a non-light emitting region; and
   a color light filtering layer disposed at a light exiting side of the displaying substrate, wherein the color light filtering layer comprises a plurality of light filtering structures, and orthographic projections of the light filtering structures on the displaying substrate cover corresponding positions of the light emitting region,
   wherein the plurality of light filtering structures comprise a first light filtering structure and a second light filtering structure, a thickness of the first light filtering structure and a thickness of the second light filtering structure are different, and a surface of the first light filtering structure at one side away from the displaying substrate and a surface of the second light filtering structure at one side away from the displaying substrate are in a same plane, and
   wherein the display panel further comprises a functional film layer disposed between the displaying substrate and the color light filtering layer, a first slot is disposed at a surface of the functional film layer at one side close to the color light filtering layer, and the first light filtering structure fills the first slot.

2. The display panel according to claim 1, wherein the plurality of light filtering structures further include a third light filtering structure; and
   the surface of the first light filtering structure at one side away from the displaying substrate, the surface of the second light filtering structure at one side away from the displaying substrate and a surface of the third light filtering structure at one side away from the displaying substrate are in the same plane.

3. The display panel according to claim 2, wherein filtered-light colors of the light filtering structures are the same as emitted-light colors of the corresponding positions of the light emitting region, and thicknesses of the light filtering structures are positively correlated with luminous efficiencies of the corresponding positions of the light emitting region.

4. The display panel according to claim 2, wherein the thickness of the first light filtering structure is larger than the thickness of the second light filtering structure, and the thickness of the second light filtering structure is larger than or equal to a thickness of the third light filtering structure.

5. The display panel according to claim 4, wherein the display panel further comprises a black matrix disposed in a same layer as the color light filtering layer, and an orthographic projection of the black matrix on the displaying substrate is located within the non-light emitting region.

6. The display panel according to claim 1, wherein
   an angle of gradient of a side wall of the first slot is larger than or equal to 20°, and less than or equal to 90°; and/or
   a minimum distance between a boundary of an orthographic projection of a bottom face of the first slot on the displaying substrate and a boundary of the orthographic projection of the black matrix on the displaying substrate is larger than or equal to −2 μm, and less than or equal to 10 μm; and/or
   a depth of the first slot is larger than or equal to 0.1 μm, and less than or equal to 2.4 μm.

7. The display panel according to claim 1, wherein the second light filtering structure is disposed on a surface of the functional film layer at one side close to the color light filtering layer; or
   a second slot is disposed at the surface of the one side of the functional film layer close to the color light filtering layer, the second light filtering structure fills the second slot, and a depth of the second slot is less than a depth of the first slot.

8. The display panel according to claim 7, wherein
   an angle of gradient of a side wall of the second slot is larger than or equal to 20°, and less than or equal to 90°; and/or
   a distance between a boundary of an orthographic projection of a bottom face of the second slot on the luminescent layer and a boundary of the orthographic projection of the black matrix on the luminescent layer is larger than or equal to −2 μm, and less than or equal to 10 μm; and/or
   a depth of the second slot is larger than or equal to 0.1 μm, and less than or equal to 2.4 μm.

9. The display panel according to claim 7, wherein the third light filtering structure is disposed on the surface of the one side of the functional film layer close to the color light filtering layer; or
   a third slot is disposed at the surface of the one side of the functional film layer close to the color light filtering layer, the third light filtering structure fills the third slot, and a depth of the third slot is less than or equal to the depth of the second slot.

10. The display panel according to claim 1, wherein the functional film layer is a touch control functional layer, and the touch control functional layer comprises at least one of a buffer layer arranged in layer configuration, a first touch electrode layer, an insulating layer, a second touch electrode layer and a first planarization layer; and
    the first touch electrode layer comprises a first touch electrode, the second touch electrode layer comprises a second touch electrode, and the first touch electrode and the second touch electrode are connected by a via hole disposed in the insulating layer.

11. The display panel according to claim 1, wherein the display panel further comprises at least one of:
    a packaging layer located between the color light filtering layer and the displaying substrate; and
    a second planarization layer located at one side of the color light filtering layer away from the luminescent layer.

12. A displaying device, wherein the displaying device comprises the display panel according to claim 1.

13. A manufacturing method, wherein the method comprises:

providing a displaying substrate, wherein the displaying substrate comprises at least one light emitting region and a non-light emitting region; and forming a color light filtering layer at a light exiting side of the displaying substrate, wherein the color light filtering layer comprises a plurality of light filtering structures, and orthographic projections of the light filtering structures on the displaying substrate cover corresponding positions of the light emitting region, wherein the plurality of light filtering structures comprise a first light filtering structure and a second light filtering structure, a thickness of the first light filtering structure and a thickness of the second light filtering structure are different, and a surface of the first light filtering structure at one side away from the displaying substrate and a surface of the second light filtering structure at one side away from the displaying substrate are in a same plane, and wherein the step of forming the color light filtering layer on the light exiting side of the displaying substrate comprises:

forming a functional film layer on the light exiting side of the displaying substrate;

performing exposure and development and/or etching to a surface of the functional film layer at one side away from the displaying substrate, to obtain a first slot; and forming the color light filtering layer at the one side of the functional film layer away from the displaying substrate, wherein the first light filtering structure fills the first slot.

* * * * *